US010026997B2

(12) United States Patent
Zhang et al.

(10) Patent No.: US 10,026,997 B2
(45) Date of Patent: Jul. 17, 2018

(54) SECONDARY ELECTROCHEMICAL BATTERY SEALING BODY WITH PACKAGED CHIP SHIELDING STRUCTURE AND BATTERY

(71) Applicant: FUJIAN NANPING NANFU BATTERY CO., LTD., Fujian (CN)

(72) Inventors: Qingshun Zhang, Fujian (CN); Jintian Chen, Fujian (CN); Haitao Chang, Fujian (CN)

(73) Assignee: FUJIAN NANPING NANFU BATTERY CO., LTD., Fujian (CN)

( * ) Notice: Subject to any disclaimer, the term of this patent is extended or adjusted under 35 U.S.C. 154(b) by 0 days.

(21) Appl. No.: 15/672,733

(22) Filed: Aug. 9, 2017

(65) Prior Publication Data

US 2017/0338521 A1 Nov. 23, 2017

Related U.S. Application Data

(63) Continuation of application No. PCT/CN2015/096611, filed on Dec. 8, 2015.

(30) Foreign Application Priority Data

Jun. 12, 2015 (CN) .......................... 2015 1 0321435
Jun. 12, 2015 (CN) ..................... 2015 2 0404078 U (51) Int. Cl.
*H01M 10/42* (2006.01)
*H01M 2/08* (2006.01)
*H05K 9/00* (2006.01)

(52) U.S. Cl.
CPC ........... *H01M 10/425* (2013.01); *H01M 2/08* (2013.01); *H05K 9/0007* (2013.01)

(58) Field of Classification Search
CPC .................................................. H01M 10/425
See application file for complete search history.

(56) References Cited

U.S. PATENT DOCUMENTS

| 2009/0111003 A1* | 4/2009 | Kim ................... | H01M 2/0413 429/53 |
|---|---|---|---|
| 2010/0136419 A1* | 6/2010 | Kwak ................ | H01M 2/0404 429/164 |

(Continued)

FOREIGN PATENT DOCUMENTS

| CN | 101425609 A | 5/2009 |
|---|---|---|
| CN | 103208594 A | 7/2013 |

(Continued)

OTHER PUBLICATIONS

International Search Report of PCT/CN2015/096611, dated Mar. 15, 2016.

(Continued)

*Primary Examiner* — Sarah A. Slifka
*Assistant Examiner* — Brian R Ohara
(74) *Attorney, Agent, or Firm* — Locke Lord LLP; Tim Tingkang Xia, Esq.

(57) ABSTRACT

A secondary electrochemical battery sealing body, including a negative electrode cap, a circuit board module, and an insulating gasket. A battery case has a recessed wire turn structure at an end thereof adjacent to the negative electrode cap. The circuit board module is located between the wire turn and the negative electrode cap, and multiple electronic components are arranged thereon. The negative electrode cap and the circuit board module constitute a first enclosed electromagnetic shielding space. The battery case and the circuit board module constitute a second enclosed electromagnetic shielding space. The electronic component is provided within the first enclosed electromagnetic shielding space and the second enclosed electromagnetic shielding (Continued)

space. The insulating gasket has a "" shape in section, and is disposed within gaps of the battery case, the circuit board module and the negative electrode cap.

11 Claims, 7 Drawing Sheets

(56) References Cited

U.S. PATENT DOCUMENTS

| | | | | |
|---|---|---|---|---|
| 2010/0159289 A1* | 6/2010 | Kim | ............ | H01M 2/0404 |
| | | | | 429/7 |
| 2012/0262083 A1* | 10/2012 | Liu | ............ | H01M 2/022 |
| | | | | 315/228 |
| 2016/0254574 A1* | 9/2016 | Li | ............ | H01M 2/105 |
| | | | | 320/107 |

FOREIGN PATENT DOCUMENTS

| | | |
|---|---|---|
| CN | 104900820 A | 9/2015 |
| CN | 204927362 U | 12/2015 |

OTHER PUBLICATIONS

State Intellectual Property Office of the P.R. China (ISR/CN), "International Search Report for PCT/CN2015/096611", China, dated Mar. 15, 2016.

\* cited by examiner

SECONDARY ELECTROCHEMICAL BATTERY SEALING BODY WITH PACKAGED CHIP SHIELDING STRUCTURE AND BATTERY

CROSS-REFERENCE TO RELATED APPLICATION

This application is a continuation application of International Patent Application No. PCT/CN2015/096611, filed on Dec. 8, 2015, which itself claims priority to Chinese Patent Application Nos. 2015103214350 and 201520404078X, filed on Jun. 12, 2015 in the State Intellectual Property Office of P.R. China, which are hereby incorporated herein in their entireties by reference.

FIELD OF THE INVENTION

The present invention relates to a secondary battery, and more particularly to a secondary electrochemical battery sealing body with a packaged chip heat dissipation structure and a battery comprising the same.

BACKGROUND OF THE INVENTION

Recently, a secondary battery (also referred to as a rechargeable battery) has been widely applied to various portable electrical and electronic devices, such as toys and handheld devices, and the energy storage requirements on the secondary battery are higher and higher. Due to advantages, such as high energy, high power discharge and being environmentally-friendly, a lithium ion secondary battery has been gradually applied in the aforementioned fields.

During normal operation, it is often necessary for the rechargeable battery to cooperate with an integrated circuit chip of the other function, so as to achieve a desired operational effect. In general, the rechargeable battery and the integrated circuit chip are packaged separately, and then used in combination through connection of a circuit board and a conducting wire. As a result, peripheral elements and production processes are large in number, the cost is high, and the rechargeable battery and the integrated circuit chip have large volume and poor performance, which is contrary to the miniaturization and microminiaturization.

When the lithium ion secondary battery is packaged, the space occupied by each part of the lithium ion secondary battery is relatively fixed, and particularly, the polymer battery cell includes a positive electrode tab, a separator and the negative electrode tab inside thereof, a battery cell top seal with a specified height is provided at one end of the positive electrode tab facing away from the separator, for packaging. Since the battery cell top seal occupies a certain height of the polymer battery cell, available space of the polymer battery cell thus can be reduced. The space utilization of the polymer battery cell has much to do with the energy density and capacity of the lithium ion secondary battery, generally speaking, the larger is the space utilization of the polymer battery cell, the larger are the energy density and capacity of the lithium ion secondary battery. Therefore, the existing lithium ion secondary battery generally has problems that the energy density and capacity of the lithium ion secondary battery are low caused by low space utilization of the polymer battery cell.

SUMMARY OF THE INVENTION

The present invention provides a secondary electrochemical battery sealing body with a packaged chip shielding structure, for closing an opening of a battery case of the secondary electrochemical battery, wherein, the sealing body includes a negative electrode cap, a circuit board module and an insulating gasket, the battery case has a recessed wire turn structure at an end thereof adjacent to the negative electrode cap; the circuit board module is located between the wire turn and the negative electrode cap, and has arranged thereon a plurality of electronic components for generating electromagnetic radiation during operation, the diameter of the circuit board module is sized to be between an inner diameter of a recess composed by the wire turn and an inner diameter of the battery case, so that the circuit board module can be stuck in one side of the wire turn for closing the opening of the battery case; the circuit board module and the negative electrode cap are connected through conductive materials, the negative electrode cap and the circuit board module constitute a first enclosed electromagnetic shielding space, the battery case and the circuit board module constitute a second enclosed electromagnetic shielding space, and the electronic component is provided within the first enclosed electromagnetic shielding space and the second enclosed electromagnetic shielding space; the insulating gasket has a " " shape in section, and disposed within gaps of the battery case, the circuit board module and the negative electrode cap, so as to press and fix the circuit board module between the wire turn and the battery case, and isolate the battery case and the negative electrode cap.

Preferably, the negative electrode cap and the steel shell outside the battery are made of metal materials.

Preferably, the negative electrode cap is fixed to the circuit board module by welding.

Preferably, the circuit negative output terminal of the circuit board module is provided at the welding site of the negative electrode cap and a circuit board, so that the negative output is collinear with circuit ground.

Preferably, a clamping head corresponding to the position of a clamping groove is provided at the edge of the negative electrode cap, for fixing the negative electrode cap on the circuit board module.

Preferably, the negative electrode cap is made of conductive materials.

Preferably, a metal ring is arranged on the contact part between the circuit board component and the negative electrode cap, the clamping groove is provided within the metal ring, and the metal ring is in conductive contact with the clamping groove, so as to constitute an enclosed electromagnetic shielding space with the negative electrode cap.

Preferably, the insulating gasket is a flexible and elastic annular insulating gasket layer.

Preferably, a part of the shaped insulating gasket is used to press and fix the circuit board module between the wire turn and the battery case, and another part thereof is used to isolate the battery case and the negative electrode cap.

Preferably, the wire turn has a recess depth of 0.2 to 1.2 mm relative to the surface of the battery case.

Preferably, the sealing body is used to close an opening of a battery case of the secondary electrochemical battery, and the battery further includes a battery cell and a positive electrode cap, the positive electrode cap is connected to the battery case so as to constitute a positive electrode of the secondary battery; the battery cell is disposed within the battery case, and located between the positive electrode cap and the wire turn structure.

The sealing body fitting for the electrochemical battery according to the present invention has reasonable and artful structural design, an electrode cover is provided at the electrode opening of the electrochemical battery, the electrode cover cooperates with the circuit board to form a shielding structure, which can prevent the external interference of the internal high-frequency component thereof, transfer heat generated by the circuit board during operation to the outside, and play the role of protecting the circuit board and the components. Besides, a wire turn structure is arranged on the battery case corresponding to the position between the battery cell and the circuit board, for positioning the relative position of the battery cell and the circuit board, and the wire turn structure cooperates the insulating gasket between the electrode cover and the battery case to fix the circuit board, without the need of any welding.

BRIEF DESCRIPTION OF THE DRAWINGS

Additional objectives, functions and advantages of the present invention will be set forth in the description of embodiments which follow, with reference to the accompanying drawings in which.

DETAILED DESCRIPTION OF THE INVENTION

Objectives and functions of the present invention and the method for achieving these objectives and functions will be elucidated with reference to exemplary embodiments. However, the present invention is not limited to the exemplary embodiments hereinafter, but can be realized in different forms. The essence of the description is merely to help persons skilled in the art to comprehensively understand specific details of the present invention.

It is to be understood that both the foregoing general description and the following detailed description are exemplary and explanatory only, and are not restrictive of the present invention, as claimed.

Hereinafter, embodiments of the present invention will be described with reference to the accompanying drawings. The same reference numbers in different figures indicate the same or similar parts, or the same or similar steps.

Figure 1A:
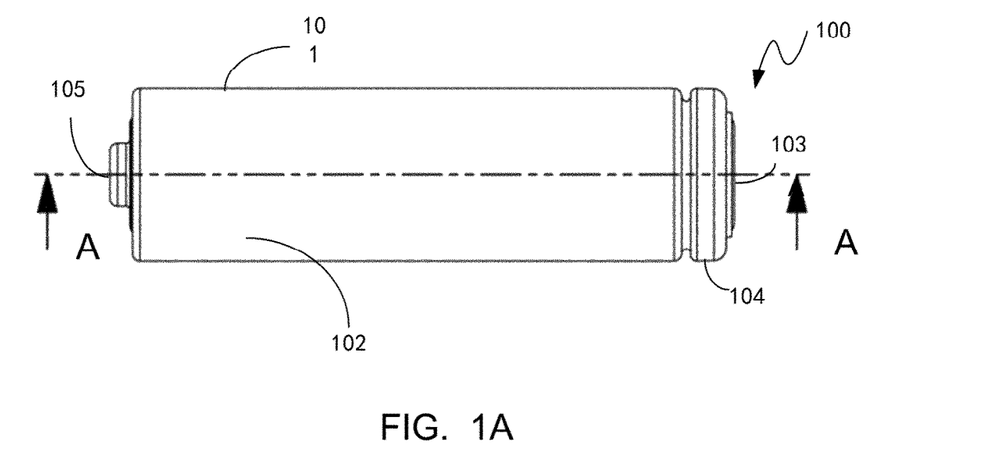
FIG. 1A schematically illustrates a structural schematic diagram of an electrochemical battery of the present invention.
Figure 1B:
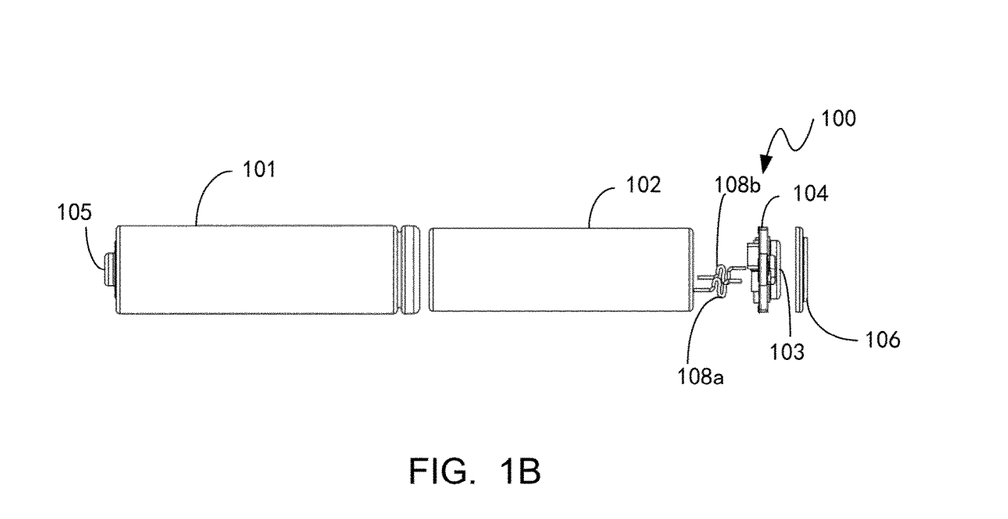
FIG. 1B is an exploded perspective view of an electrochemical battery of the present invention.

The present invention provides a secondary electrochemical battery, FIG. 1A and FIG. 1B are a structural schematic diagram and an exploded perspective view of an electrochemical battery of the present invention, respectively. As shown in FIG. 1A and FIG. 1B, an electrochemical battery 100 includes: a battery case 101, a battery cell 102 disposed within the battery case 101, a negative electrode cap 103, a circuit board module 104 disposed in the space between the battery cell 102 and the negative electrode cap 103 and a positive electrode cap 105. The negative electrode cap of the present invention has functions of electromagnetic shielding, electrostatic shielding and heat dissipation. The battery case 101 is sleeved outside battery cell 102, the battery case 101 is a cylinder or rectangular parallelepiped steel shell, for outputting the positive electrode and fixing the circuit board module 104. According to an embodiment of the present invention, the positive electrode cap 105 and the battery case 101 form an integrated structure with right-handed rotation.

Figure 1C:
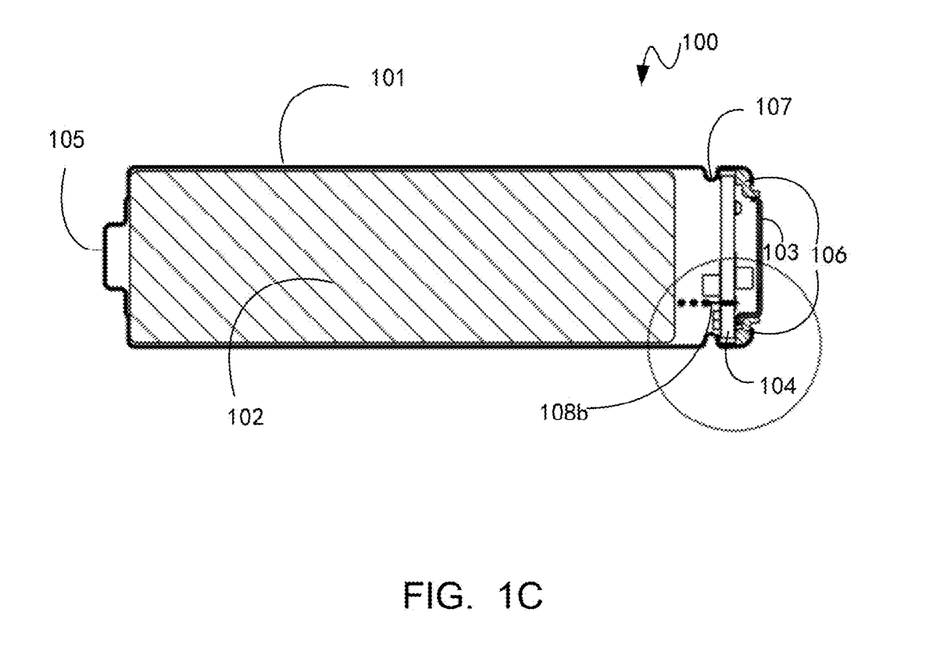
FIG. 1C is a cross-sectional view of FIG. 1A taken along the direction of A-A.
Figure 1D:
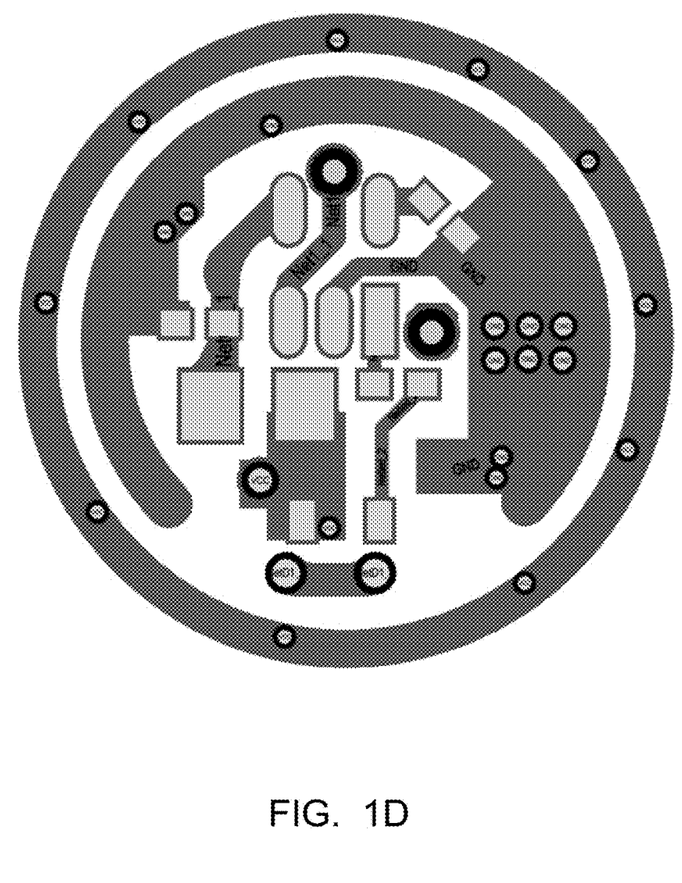
FIG. 1D is a circuit schematic diagram of a circuit board module of the present invention.

The circuit board module 104 is at least one layer of printed circuit board (PCB), has a first side and a second side, particularly, the first side points to the negative electrode cap 103 relative to the electrochemical battery 100, and the second side points to the battery cell 102 relative to the electrochemical battery 100. PCB is a circuit board (as shown in FIG. 1D) with a wiring pattern printed thereon, and has a size substantially corresponding to the inner diameter of the case of the battery 100. A plurality of printed conductors and components are arranged on the first side or the second side of the circuit board module 104. The circuit board module 104 is arranged near the negative electrode cap 103 side of the battery 100, and located between the battery cell 102 and the negative electrode cap 103. The circuit board module 104 is provided with connectors for fixing the negative electrode cap 103 on the circuit board module 104, for example, the negative electrode cap 103 can be fixed on the circuit board module 104 by welding, by clamping, or the like. The circuit board module is used for charging protection and charging indication of the lithium battery, also can be used for discharge protection, short circuit protection, and over-discharge protection of the battery and output voltage control. Electrode connecting wires 108a and 108b are provided between the circuit board module 104 and the battery cell 102, leading out positive and negative electrodes of the battery, respectively, particularly, 108a is a positive electrode connecting wire while 108b is a negative electrode connecting wire. FIG. 1C is a cross-sectional view of FIG. 1A taken along the direction of A-A. Insulating gaskets 106 are provided between the circuit board module 104 and exterior battery case 101, between the negative electrode cap 103 and the battery case 101. The insulating gasket 106 is a flexible and elastic annular insulating gasket layer, and has a "⌐" shape in section A-A of the electrochemical battery 101. The insulating gasket 106 can play a role of isolating the battery case 101 of the first electrode and the negative electrode cap 103 of the second electrode, and can press and fix the circuit board module 104 due to the elasticity of the insulating gasket layer 106, and can seal the gap between the battery case 101 and the negative electrode cap 103. In particular, as shown in FIG. 1C, a part of the ⌐ shape is used to press and fix the circuit board module 104 between the wire turn 107 and the battery case 101, and another part thereof is used to isolate the battery case 101 and the negative electrode cap 103.

A ring of inward annular recess, that is wire turn 107, is provided on an outer surface of the battery case 101 corresponding to the position between the battery cell 102 and the circuit board module 106. The battery cell 102 is disposed within the battery case 101, and located between the positive electrode cap 105 and the wire turn 107 structure. The insulating gasket layer 106 and the wire turn 107 are arranged so that the circuit board module 104 is fixed between the annular recess of the battery case 101 and the bottom of the battery case 101, and therefore, the battery case 101 and the negative electrode cap 103 are connected without the need of any welding.

The structure of the wire turn 107 is arranged to position the circuit board module 104, in particular, the diameter of the circuit board module 104 is sized to be between the inner diameter of the annular recess composed by the wire turn 107 and the inner diameter of the battery case 101, when the battery is assembled, the battery cell 102 is disposed within the battery case 101 first, then the circuit board module 104 is assembled in the battery case 101, the circuit board module 104 is sized to be stuck in the structure of the wire turn 107, so as to avoid contact with the battery cell 102, then the battery case 101 and the negative electrode cap 103 are isolated through the insulating gasket 106 to complete the assembly of the battery 100. The above structure allows the circuit board module 104 to constitute an enclosed space for receiving the battery cell 102 within the battery case 101 by means of the wire turn 107, so that the volume of the battery cell 102 can be increased, and thereby the capacity of the secondary battery can be increased. Preferably, the battery cell 102 is a closed structure, the positive and negative electrodes are led out from inside the battery cell 102, and then connected to corresponding positive and negative electrodes of the battery.

Preferably, the wire turn 107 has a recess depth of 0.2 to 1.2 mm relative to the surface of the battery case 101.

Figure 2A:
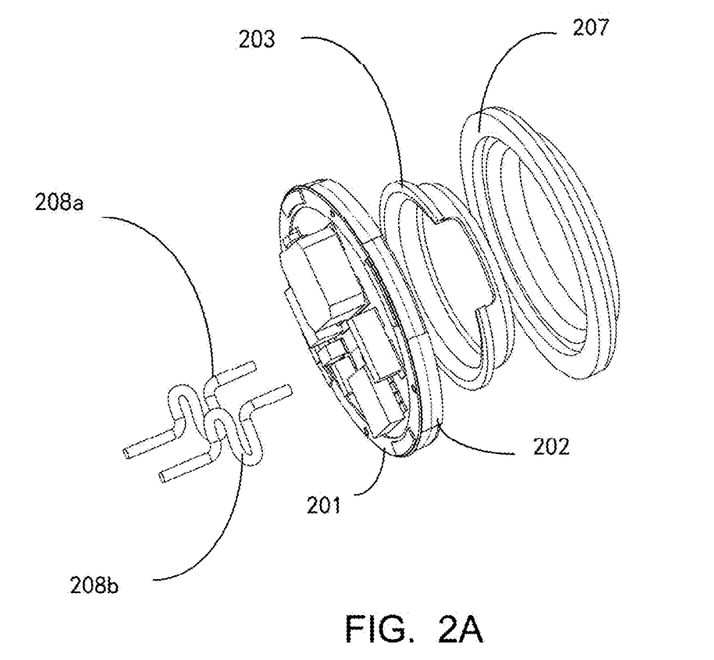
FIG. 2A schematically illustrates an exploded perspective structural schematic diagram of an electrochemical battery sealing body fitting 200 for the secondary electrochemical battery according to the first embodiment of the present invention.
Figure 2B:
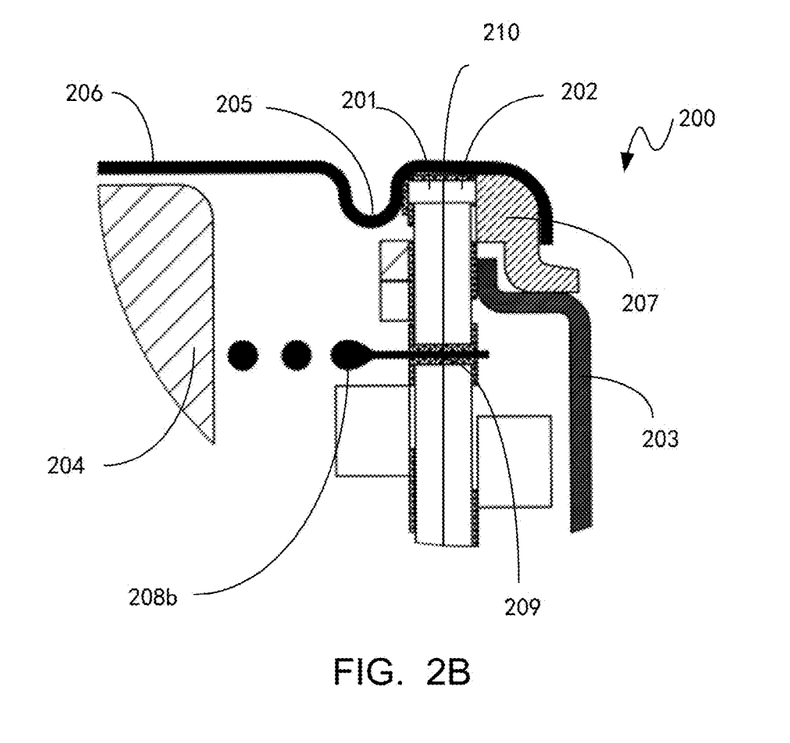
FIG. 2B schematically illustrates an enlarged partial cross-sectional view of an electrochemical battery sealing body fitting 200 according to the first embodiment of the present invention.

FIG. 2A schematically illustrates an exploded perspective structural schematic diagram of an electrochemical battery sealing body fitting 200 for the secondary electrochemical battery according to the first embodiment of the present invention. FIG. 2B schematically illustrates an enlarged partial cross-sectional view of an electrochemical battery sealing body fitting 200 according to the first embodiment of the present invention. As shown in FIG. 2A and FIG. 2B, the electrochemical battery sealing body fitting 200 includes a first PCB 201, a second PCB 202, a negative electrode cap 203 and an insulating gasket 207 arranged among the second PCB 202, outside of the negative electrode cap 203 and the battery case 206. According to an embodiment of the present invention, the first PCB 201 and the second PCB 202 are two printed circuit boards with the same areas. The first PCB 201 is adjacent to the battery cell 204 while the second PCB 202 is remote from the battery cell 204. The first PCB 201 is clamped onto the battery case 206 via the wire turn 205. The second PCB 202 is electrically connected to the negative electrode cap 203 by contact, and forms a shielding structure therewith. A plurality of chips or circuit components are arranged on the side where the first PCB 201 is adjacent to the battery cell 204 and the second PCB 202 is remote from the battery cell 204, particularly, electronic components for generating electromagnetic radiation during operation are arranged on the shielding structure consisting of the second PCB 202 and the negative electrode cap 203. The insulating gasket 207 is arranged among the second PCB 202, outside of the negative electrode cap 203 and the battery case 206. The insulating gasket 207 is a flexible annular insulating gasket layer, can press and fix the first PCB 201 and the second PCB 202 to the wire turn 205 to seal the gap between the battery case 206 and the negative electrode cap 103. Reinforced contact tinning 210 is provided at the contact portion of the battery case 206 with the first PCB and the second PCB, so as to seal the gap between the circuit board and the battery case. The negative electrode connecting wire 208b (208a is the positive electrode connecting wire, not shown) led out from the battery cell 204 is connected to conducting wires on the first PCB and the second PCB via a through-hole 209 between the first PCB and the second PCB. Conductive materials, such as copper plating, are plated on the inner surface of the through-hole 209, and therefore, wiring of multiple circuit boards can be connected together via the through-hole 209, and connected to the contact portion of the negative electrode cap and the circuit board, so as to transfer it to the negative electrode cap.

A large number of electronic elements are integrated on the circuit board module of the secondary electrochemical battery according to the present invention, and the degree of integration is high, some electronic elements, such as inductive coils, will generate electromagnetic radiation during operation, therefore, when the secondary electrochemical battery is used, the electromagnetic radiation generated by these electronic elements will affect the electronic device using these batteries. For example, when a battery is used on an electronic device, such as a loudspeaker, the electromagnetic radiation generated by the built-in electronic elements of the battery itself will disturb the loudspeaker itself, if not shielded, and thus generate an undesired squealing noise and affect the effect of using the electronic device. The sealing body fitting 200 according to the present invention can make use of the arranged special structure to achieve effective electromagnetic radiation shielding of electronic elements on the PCB.

In particular, according to an embodiment of the present invention, a clamping groove 208 is arranged on another side of the PCB board relative to the wire turn 205, that is, the side of the second PCB 202 facing the negative electrode cap 203 shown in FIG. 2, for clamping and fixing the negative electrode cap 203. In order to achieve good electromagnetic radiation shielding, the shape of the clamping groove 208 should correspond to the edge shape of the negative electrode cap 203. For example, if the battery is a cylindrical battery, the negative electrode cap 203 is in a circular shape, and then the clamping groove 208 should be in an annular shape corresponding to the circular shape. When the negative electrode cap 203 is in a rectangular shape, and then the clamping groove 208 should be in a rectangular shape corresponding to the rectangular shape. A part of the region of the circuit board module surrounded by the clamping groove 208 constitutes a closed space 209 jointly with the negative electrode cap 203, an electronic element (such as an inductor) generating electromagnetic radiation is arranged within the closed space 209 on the side of the circuit board module facing the negative electrode cap 203, which can effectively shield electromagnetic radiation of the electronic element, and thus can eliminate electromagnetic disturbing influences of the electronic device using the battery. A conductive material layer, such as a metal plating layer, is provided on the inner wall (namely, the contact surface with the negative electrode cap 203) of the clamping groove 208, so as to be in conductive contact with the negative electrode cap 203, and thus constitute an enclosed electromagnetic radiation space.

The negative electrode cap is preferably made of conductive materials, so as to effectively shield electromagnetic radiation generated by the electronic element. For example, the negative electrode cap 203 is made of metal.

Persons skilled in the art can understand that, the case that the sealing body fitting 200 as shown in FIG. 2 includes two PCBs are only illustrative, and the sealing body fitting according to the present invention is also applicable to the case of one PCB or a combination of a multilayer PCB.

Figure 3:
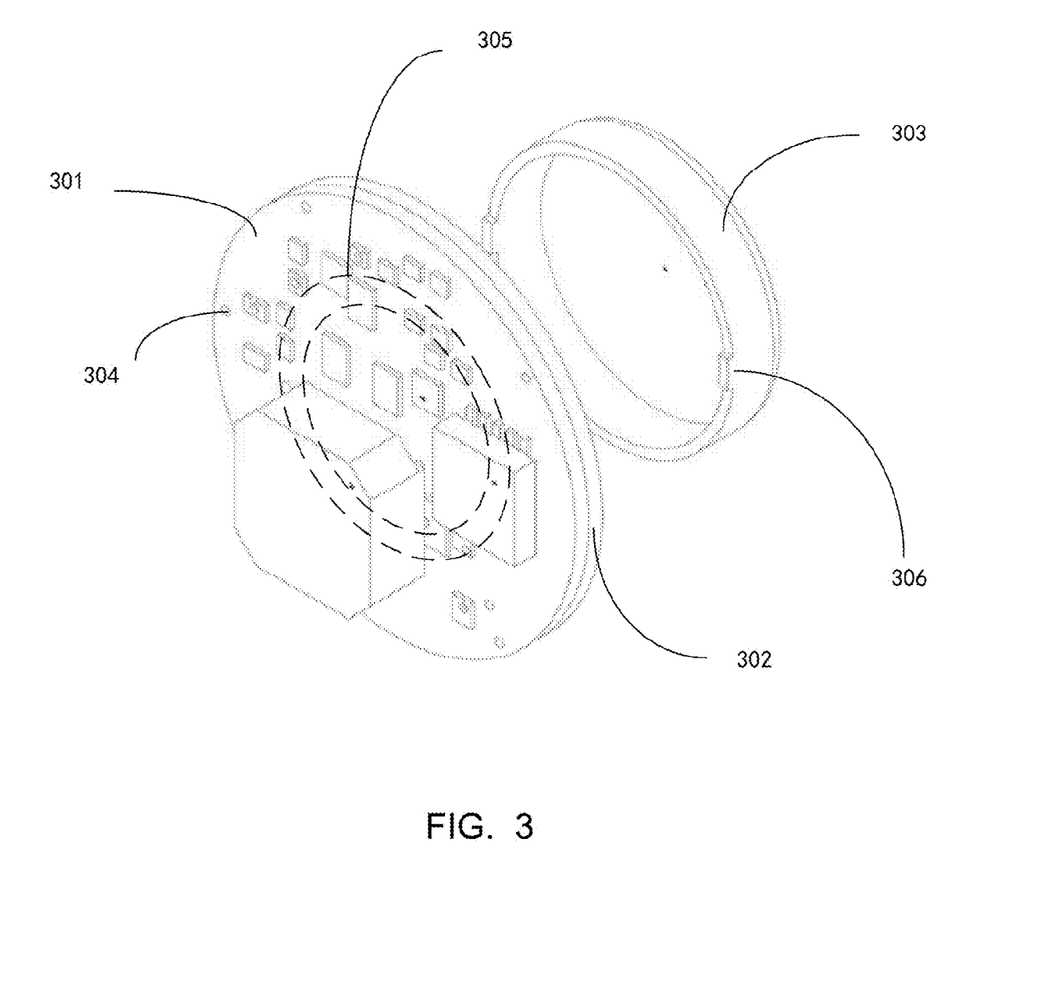
FIG. 3 is an exploded perspective view of a sealing body fitting 300 for an electrochemical battery according to the second embodiment of the present invention.

FIG. 3 is an exploded perspective view of a sealing body fitting 300 for an electrochemical battery according to the second embodiment of the present invention. The sealing body fitting 30 includes a first PCB 301, a second PCB 302 and a negative electrode cap 303. Particularly, the first PCB 301 and the second PCB 302 are arranged with a plurality of circuit components. A plurality of small holes 304 are arranged on the edge of the first PCB 301 and the second PCB 302, for fixing the first PCB 301 and the second PCB 302 together. According to an embodiment of the present invention, a clamping groove 305 (shown by the dotted line) is provided on a side where the second PCB 302 is connected to the negative electrode cap 303 corresponding to the edge of the negative electrode cap 303, then the edge of the negative electrode cap 303 is provided with a clamping head 306 corresponding to the clamping groove 305, for fixing the negative electrode cap 303 on the second PCB 302, achieving electrical connection and constituting an enclosed electromagnetic shielding space.

Figure 4:
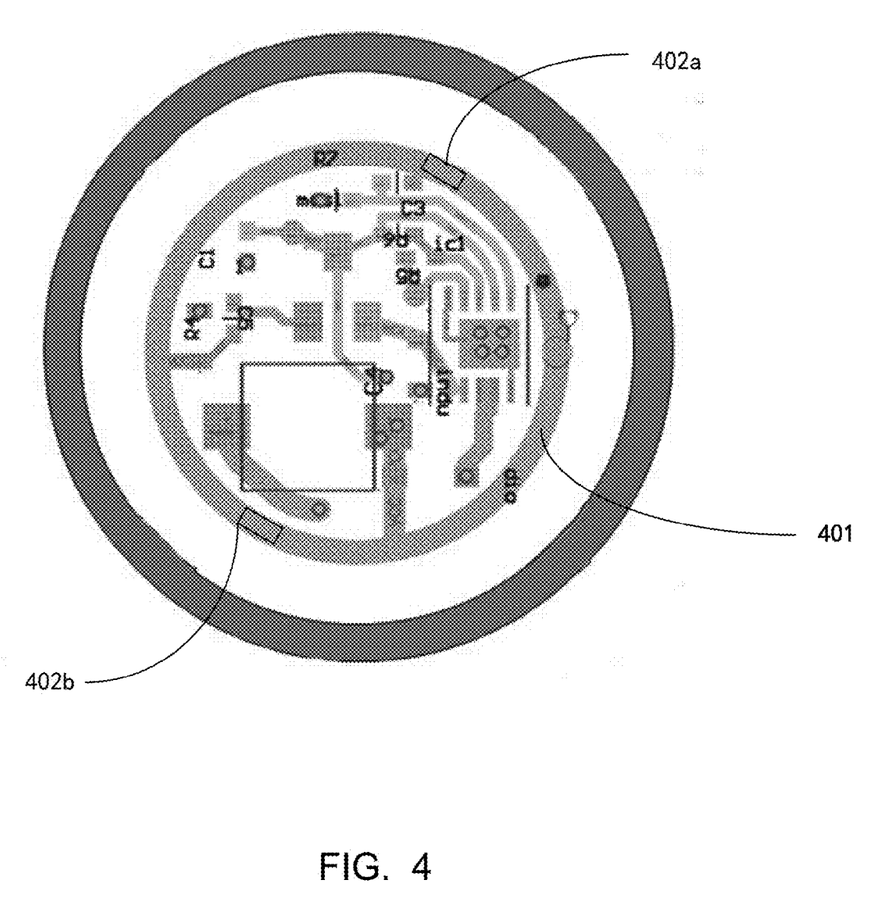
FIG. 4 is a structural schematic diagram of the second printed circuit board in another embodiment according to the second embodiment of the present invention.

FIG. 4 shows an electromagnetic shielding structure according to another embodiment of the present invention. As shown in FIG. 4, a clamping groove 402 is defined on a side of the second PCB 302 corresponding to the negative electrode cap 303, and FIG. 4 illustrates two opposite clamping grooves 402a and 402b. A metal ring 401 is arranged on the contact part between the second PCB 302 and the negative electrode cap 303, the clamping grooves 402a and 402b are provided within the metal ring 401, and the metal ring 401 is in conductive contact with the clamping grooves 402a and 402b, and a metal layer, being in conductive contact with the metal ring 401, is provided on the inner wall of the clamping grooves 402a and 402b. After clamping on the second PCB 302 through the clamping groove 402, the negative electrode cap 303 is in contact with the metal ring 401 by means of the clamping groove 402, so as to cooperate to function as an electromagnetic shielding shroud. The material of the negative electrode cap 303 is metal.

Figures 5A, 5B:
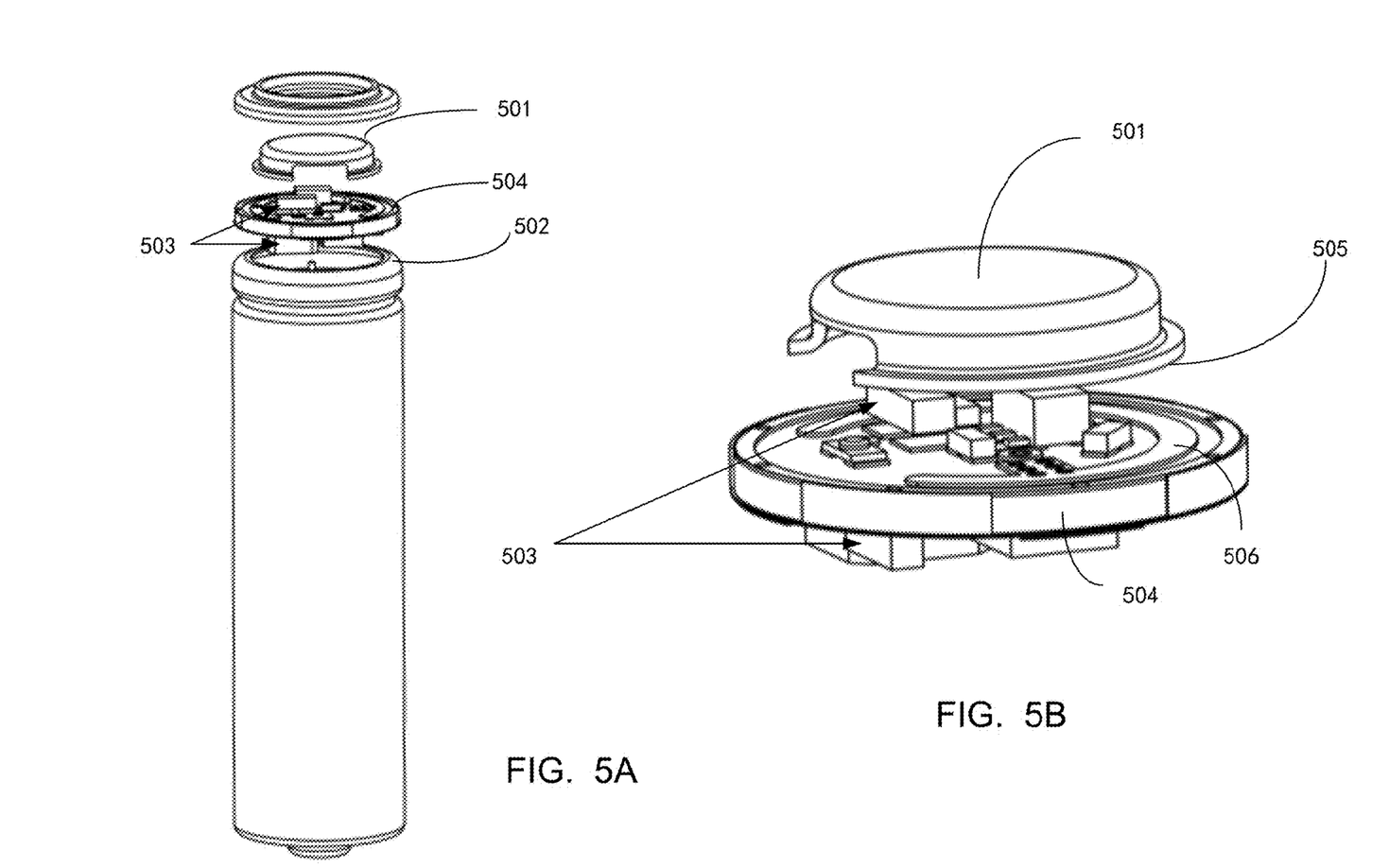
FIG. 5A is a structural schematic diagram of a shielding structure according to the third embodiment of the present invention.
FIG. 5B is an enlarged partial structural schematic diagram of FIG. 5A.

FIG. 5A is a schematic diagram of a shielding structure of a battery sealing body according to the third embodiment of the present invention. As shown in FIG. 5A, the negative electrode cap 501 and the battery housing 502 are arranged on the two sides of the circuit board 504, and materials of the two are both enclosed metallic housings, the negative electrode cap 501 and the circuit board module 504 constitute a first enclosed electromagnetic shielding space, the battery case 502 and the circuit board module 504 constitute a second enclosed electromagnetic shielding space, and the two enclosed electromagnetic shielding spaces can nicely enclose interference of electromagnetism generated by the circuit on external electric appliances, and nicely shield damage of the external static electricity on the electronic elements 503 in an internal circuit of the battery. FIG. 5B is an enlarged schematic diagram of a shielding structure of a battery sealing body. As shown in FIG. 5B, the negative electrode cap 501 is welded on the circuit board 504, and the position of the circuit negative output terminal on the circuit board 504 is the welding site 506 of the negative electrode cap 501 and the circuit board 504, so that the negative output is collinear with circuit ground, and the induced electricity generated by the high-frequency electronic elements 503 goes back to the ground and cannot be transmitted to the outside. Preferably, the shape at the welding site 506 is a "C"-shaped annular structure.

The sealing body fitting for the electrochemical battery according to the present invention has reasonable and artful structural design, an electrode cover is provided at the electrode opening of the electrochemical battery, the electrode cover cooperates with the circuit board to form a shielding structure, which can prevent the external interference of the internal high-frequency component thereof, transfer heat generated by the circuit board during operation to the outside, and play the role of protecting the circuit board and the components. Besides, a wire turn structure is arranged on the battery case corresponding to the position between the battery cell and the circuit board, for positioning the relative position of the battery cell and the circuit board, and the wire turn structure cooperates the insulating gasket between the electrode cover and the battery case to fix the circuit board, without the need of any welding.

Other embodiments of the present invention are all readily contemplated and appreciated to persons skilled in the art from consideration of the specification and practice of the present invention disclosed herein. The specification and embodiments are considered to be exemplary only, with the true scope and spirit of the present invention being indicated by the claims.

What is claimed is:

1. A secondary electrochemical battery sealing body with a packaged chip shielding structure, for closing an opening of a battery case of the secondary electrochemical battery, wherein, the sealing body comprises a negative electrode cap, a circuit board module and an insulating gasket, the battery case has a recessed wire turn structure at an end thereof adjacent to the negative electrode cap;

the circuit board module is located between the wire turn and the negative electrode cap, and has arranged thereon a plurality of electronic components for generating electromagnetic radiation during operation, the diameter of the circuit board module is sized to be between an inner diameter of a recess composed by the wire turn and an inner diameter of the battery case, so that the circuit board module can be stuck in one side of the wire turn for closing the opening of the battery case; the circuit board module is a printed circuit board of at least one layer, the circuit board module and the negative electrode cap are connected through conductive materials, the negative electrode cap and the circuit board module constitute a first enclosed electromagnetic shielding space, the battery case and the circuit board module constitute a second enclosed electromagnetic shielding space, and the electronic component is provided within the first enclosed electromagnetic shielding space and the second enclosed electromagnetic shielding space; and the insulating gasket has a "⊥" shape in section, and disposed within gaps of the battery case, the circuit board module and the negative electrode cap, so as to press and fix the circuit board module between the wire turn and the battery case, and isolate the battery case and the negative electrode cap.

2. The secondary electrochemical battery sealing body according to claim 1, wherein, the negative electrode cap and the battery case is made of metal materials.

3. The secondary electrochemical battery sealing body according to claim 1, wherein, the negative electrode cap is fixed to the circuit board module by welding.

4. The secondary electrochemical battery sealing body according to claim 3, wherein, the circuit negative output terminal of the circuit board module is provided at the welding site of the negative electrode cap and a circuit board, so that the negative output is collinear with circuit ground.

5. The secondary electrochemical battery sealing body according to claim 1, wherein, the sealing body includes a first PCB, a second PCB and a negative electrode cap, a clamping groove is provided on a side where the second PCB is connected to the negative electrode cap corresponding to the edge of the negative electrode cap, then the edge of the negative electrode cap is provided with a clamping head corresponding to the clamping groove, for fixing the negative electrode cap on the second PCB, for fixing the negative electrode cap on the circuit board module.

6. The secondary electrochemical battery sealing body according to claim 5, wherein, the negative electrode cap is made of conductive materials.

7. The secondary electrochemical battery sealing body according to claim 5, wherein, a metal ring is arranged on the contact part between the second circuit board module and the negative electrode cap, the clamping groove is provided within the metal ring, and the metal ring is in conductive contact with the clamping groove, so as to constitute an enclosed electromagnetic shielding space with the negative electrode cap.

8. The secondary electrochemical battery sealing body according to claim 1, wherein, the insulating gasket is a flexible annular insulating gasket layer.

9. The secondary electrochemical battery sealing body according to claim 1, wherein, a part of the  shaped insulating gasket is used to press and fix the circuit board module between the wire turn and the battery case, and another part thereof is used to isolate the battery case and the negative electrode cap.

10. The secondary electrochemical battery sealing body according to claim 1, wherein, the wire turn has a recess depth of 0.2 to 1.2 mm relative to the surface of the battery case.

11. A secondary electrochemical battery comprising the battery sealing body according to claim 1, wherein, the sealing body is used to close an opening of a battery case of the secondary electrochemical battery, and the battery further comprises a battery cell and a positive electrode cap, wherein, the positive electrode cap is connected to the battery case so as to constitute a positive electrode of the secondary battery;

the battery cell is disposed within the battery case, and located between the positive electrode cap and the wire turn structure.

* * * * *